United States Patent [19]

Gajda et al.

[11] Patent Number: 4,839,715
[45] Date of Patent: Jun. 13, 1989

[54] CHIP CONTACTS WITHOUT OXIDE DISCONTINUITIES

[75] Inventors: Joseph J. Gajda; Kris V. Srikrishnan, both of Wappingers Falls; Paul A. Totta, Poughkeepsie; Francis G. Trudeau, Wappingers Falls, all of N.Y.

[73] Assignee: International Business Machines Corporation, Armonk, N.Y.

[21] Appl. No.: 87,478

[22] Filed: Aug. 20, 1987

[51] Int. Cl.$^4$ .............................................. H01L 23/48
[52] U.S. Cl. ............................................ 357/71; 357/67
[58] Field of Search .................... 357/71, 67, 68, 40

[56] References Cited

U.S. PATENT DOCUMENTS

| | | | |
|---|---|---|---|
| 4,028,206 | 7/1977 | King | 204/192 |
| 4,154,874 | 5/1979 | Howard et al. | 427/91 |
| 4,214,018 | 7/1980 | Halon et al. | 427/100 |
| 4,307,132 | 12/1981 | Chu et al. | 427/90 |
| 4,460,618 | 7/1984 | Heinecke et al. | 427/39 |
| 4,525,221 | 6/1985 | Wu | 148/1.5 |

Primary Examiner—Andrew J. James
Assistant Examiner—Mark Prenty
Attorney, Agent, or Firm—William T. Ellis

[57] ABSTRACT

An integrated circuit chip including a first and a higher second surface levels with an abrupt sidewall step transition therebetween, and having a first layer of a first conductive material disposed over the first surface level and over the second surface level, but terminating on the first surface level in a first end portion which extends up to but does not touch the sidewall. This end portion comprises a conductive material which has been converted to an insulator. A second layer of a second conductive material is disposed on top of the first conductive layer with essentially no conductive material conversion to insulator therein adjacent to the abrupt sidewall transition. In a preferred embodiment, the conductive material is an alloy of aluminum and the end portion is aluminum oxide.

21 Claims, 1 Drawing Sheet

CHIP CONTACTS WITHOUT OXIDE DISCONTINUITIES

BACKGROUND OF THE INVENTION

The present invention relates generally to metal contact layers for integrated circuit chips, and more particularly to such metal contact layers which are devoid of opens and direct shorts to semiconductor.

The deposition of conductive material over a topography which includes an abrupt vertical step frequently results in opens or shorts through to the underlying semiconductor. Such opens or shorts cause significant declines in chip yield. Unfortunately, such vertical steps are common throughout most chips due to the need to etch through insulator layers overlying chip devices to make electrical contact thereto. Such problems are particularly severe where the sidewalls of the abrupt steps overhang a portion of the bottoms of the steps. Attempts have been made to avoid these opens and shorts by using tantalum or tungsten silicides as the wiring layer. However, such silicides have too much electrical resistance, resulting in significant heat generation. Accordingly, tantalum or tungsten silicide wiring is unacceptable for dense bipolar chip applications.

Other approaches to this problem have centered around using wide metal bands and a series of intermediate steps in place of one abrupt step. However, these approaches use a significant amount of chip real estate, thereby limiting chip device and circuit density.

The invention as claimed provides a structure and a method for eliminating shorts and opens in the contacts made through one or more insulator layers to electrical devices and circuit elements therebelow.

SUMMARY OF THE INVENTION

Briefly, the present invention comprises an integrated circuit chip, including
 a first surface at a first approximate level;
 a second surface at a second different level approximately parallel to the first surface;
 a substantially abrupt transition between the first surface and the second surface, including a sidewall;
 a first layer of a first conductive material disposed over the first surface and disposed over the second surface, but terminating on the first surface in a first end portion which extends up to but does not touch the sidewall, the first layer having a thickness of less than the difference between the first and second levels,
 wherein the end portion of the first layer of conductive material has been converted to an insulator; and
 a second layer of a second conductive material disposed on top of the first layer, with essentially no conductive material conversion to insulator therein adjacent to the abrupt transition.

In one embodiment of the present invention, the first layer disposed over the second surface has a second end portion disposed at an edge of the second surface above the abrupt transition, and wherein the second end portion of the first layer of conductive material has been converted to insulator.

A further feature of the present invention is that there is a region of the first layer adjacent to the insulator end portion which has a lower material density than the bulk of the first layer.

In yet a further embodiment of the present invention, the insulator-converted end portion of the first layer on the first surface adjacent to the abrupt transition and the insulator-converted end portion of the first layer on the second surface adjacent to the abrupt transition meet to form a continuous insulator seam along the abrupt transition. This continuous insulator seam has a length which is less than fifty percent of the total combined thickness of the first and second layers.

If only one end portion is formed in the contact, it is preferred that this insulator-converted end portion have a length which is less than thirty-three percent of the total combined thickness of the first and second layers. Typically, this insulator-converted end portion will have a length rising from the first surface in the range of 900–1800 Angstroms.

In one embodiment of the present invention, the conductive material for the first and second layers may be an alloy of aluminum and the end portions may comprise species of aluminum oxide.

The present invention further comprises a method for forming the inventive structure disclosed previously. This method comprises the steps in a processing chamber of
 providing oxygen in the atmosphere of the processing chamber;
 depositing a first conductive layer on to a step to a first thickness which is less than the height of the step, with the first layer terminating in an end portion on the lower level of the step below the step overhang, but not touching the base of the step, the depositing step being performed at a first temperature and a first rate chosen to insure maximum gettering of undesired elements and to insure that the end portion of the first conductive layer is converted to an insulator;
 depositing a second conductive layer to a thickness which is at least three times the thickness of the first layer with a deposition temperature which is initially ramped from the first temperature to a second temperature which is at least fifty percent greater than the first temperature and at a higher second rate relative to the first rate so that conversion of the second conductive layer to insulator is minimized.

In a preferred embodiment, the first temperature is less than 125° and preferably on the order of 100° C. The first rate is preferably less than 6 Angstroms per second, and the second rate is greater than 15–20 Angstroms per second.

DETAILED DESCRIPTION OF THE PREFERRED EMBODIMENT

The present invention will be described and discussed in the context of covering steps for collector, emitter, and Schottky barrier diode contacts. However, the present invention is not limited thereto, but has wide applicability to any situation wherein an abrupt step must be covered by a conductive material.

Figure 1:
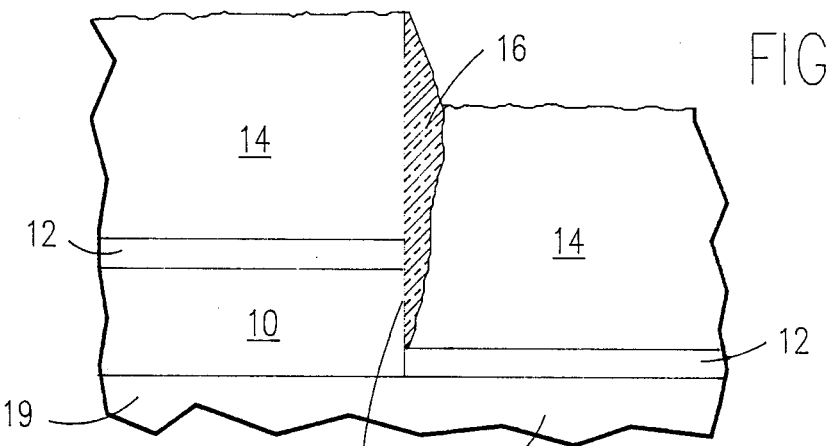
FIG. 1 is representation of a complete oxide seam through a conductive layer that will lead to an open circuit failure.

Referring now to FIG. 1, there is shown a representation of a conductive contact to a semiconductor device which is prone to failure. With reference to the Figure, the layer 10 will typically be some form of insulator material such as silicon dioxide or silicon nitride disposed over a semiconductor or conductor material 19 therebelow. This layer 10 will have an abrupt or reentrant step 18 formed therein in order to facilitate contact with the semiconductor or conductor material 19. A layer 14 of conductive material is provided for forming the contact. A layer 12 of a barrier metallurgy is provided for preventing the penetration of the contact metal layer 14 through to the semiconductor layer 19. It can be seen from the Figure that there is a vertical insulator seam 16 which occurs right at the abrupt step 18 for the structure. In a typical embodiment, the conductive contact metal layer 14 may be an alloy of aluminum, i.e., AlCu, and the insulator seam 16 may comprise aluminum oxide. This aluminum oxide seam 16 is electrically resistive and subject to high stresses. Localized heating of this seam during later process steps causes differential expansion of materials, causing the oxide to open, resulting in device failure.

Figure 2:
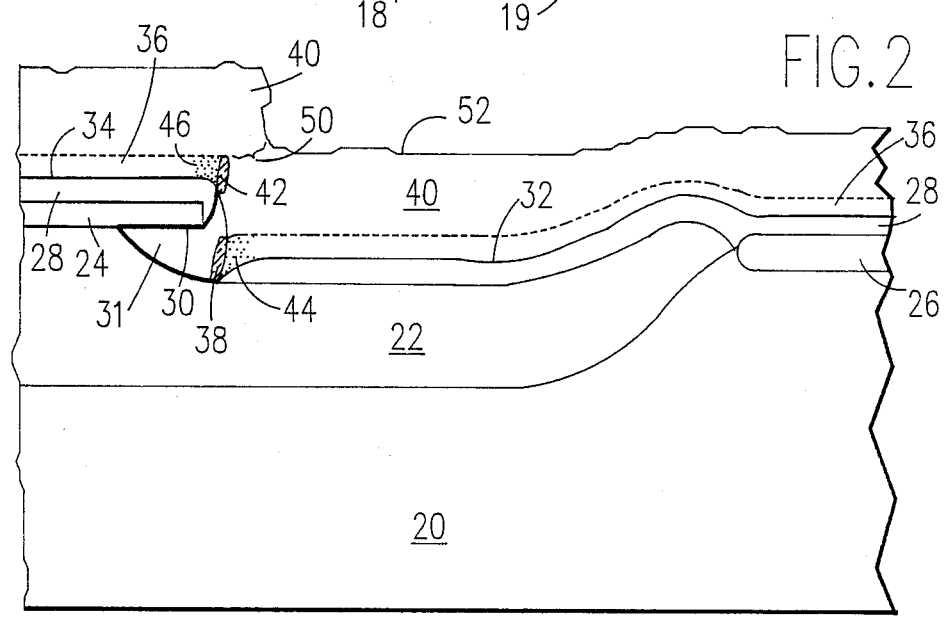
FIG. 2 is a cross-sectioned diagram of a step at a collector contact formed in accordance with the present invention.

Referring now to FIG. 2, there is shown one embodiment of the present invention. FIG. 2 illustrates a profile of a step at a collector contact for a device formed therebelow in the chip. In this example, the area 20 comprises either doped or undoped semiconductor material such as, for example, silicon. The layer 22 is a recessed oxide insulator layer, and may be typically comprised of silicon dioxide. The layer 24 may comprise silicon nitride. The layer 26 may comprise platinum silicide. The layer 28 may comprise a typical barrier metallurgy for preventing the conductive material of the contact from penetrating to the semiconductor layer 20. It can be seen from a review of the Figure that there is a substantially abrupt transition or step 30 in the topography of the layers. Such steps are typically in the range of 2000-8000 Angstroms. The top surface 32 of the barrier layer 28 to the right of the abrupt transition step 30 comprises a first surface at a first approximate level. Likewise, the top surface 34 of the barrier layer 28 to the right of the abrupt transition step 30 comprises a second surface at a second different level approximately parallel to the first surface.

A first layer 36 of a first conductive material is disposed over the first surface 32 and over the second surface 34. This first layer 36 disposed over the first surface 32 terminates in a first end portion 38 adjacent to but not touching the abrupt step sidewall step 30. This first layer has a thickness of less than the difference between the first and second levels. The first end portion 38 of the first layer of conductive material has been converted to an insulator. A second layer 40 of a second conductive material is disposed on top of the first layer 36, with essentially no conductive material conversion to insulator adjacent to the abrupt transition.

In many applications, the process used to form the abrupt step to make electrical contact to the device therebelow comprises an etching process which has a tendency to undercut laterally as it etches downward. Accordingly, the sidewall for the abrupt transition 30 is typically angled to overhang a portion of the first layer 36, such that the first end portion 38 of the first layer 36 terminates under the sidewall overhang.

In some embodiments of the present invention, that portion of the first layer 36 disposed over the second surface 34 will have a second end portion 42 disposed at an edge of the second surface 34 above the abrupt step transition 30, with the second end portion 42 of the first layer of conductive material being converted to an insulator.

In some embodiments of the present invention, regions 44 and 46 of the first layer 36 adjacent to the respective first and second insulator end portions 38 and 42 have a lower material density (more porosity) as compared to the bulk of the conductive material of the first layer 36.

In one embodiment of the present invention, the first and second conductive material layers 36 and 40 may be aluminum alloys such as alloys of aluminum and copper. A typical barrier layer 28 which may be utilized to prevent the penetration of the aluminum through to the semiconductor 20 is a $Cr/Cr_2O_3$ "cermet" mixture. For aluminum alloy layers 36 and 40, the first and second end portions 38 and 42 may be conveniently converted to an insulator such as aluminum oxide. In some embodiments of the present invention where the first and second conductive materials in the layers 36 and 40 are the same material, the second conductive material layer 40 will have a greater density than the first conductive material layer 36, prior to sintering.

In a preferred embodiment, when only the first insulator-converted end portion 38 is present, this end portion should have a length which is less than thirty-three percent of the total combined thickness of the first and second conductive layers 36 and 40. In embodiments where each of the first and second insulator-converted end portions 38 and 42 are present, then each of these end portions should have a length which is less than twenty-five percent of the combined total of the lengths of the first and second layers 36 and 40. In a preferred embodiment, each of these insulator-converted end portions may have a length in the range of 900-1800 Angstroms.

It can be seen from a review of FIG. 2 that there will be a good coverage area 50 in the second conductive layer 40 in every instance, which will guarantee that there are no continuous vertical seams of insulator or continuous vertical voids extending from the bottom of the step, i.e., surface 32, to the top surface 52 of the second layer 40. This structure thus insures that there will be no opens or shorts for this contact, despite the abrupt step topography being covered.

Figure 3:
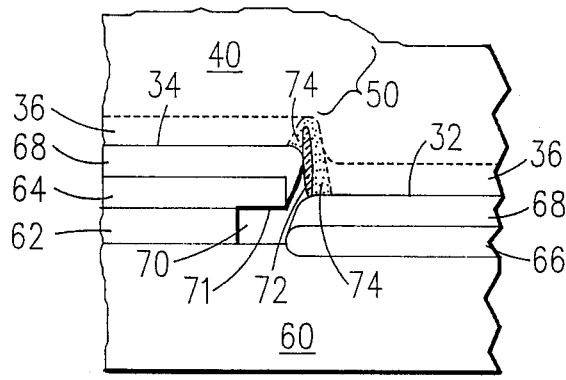
FIG. 3 is a cross-sectioned diagram of a step at an emitter or a Schottky barrier diode contact formed in accordance with the present invention.

Referring now to FIG. 3, there is shown a profile of an emitter or a Schottky barrier diode contact step. Again, it should be noted that the present invention is not limited to emitter or SBD contacts, but is applicable wherever an abrupt step occurs in the device topography. In the example shown in FIG. 3, an area 60 typically comprises some form of semiconductor material. For emitter contacts, the semiconductor material below the trench step is typically highly doped. An insulator layer 62 is disposed over a portion of the semiconductor material 60, and may be, for example, an insulator such as silicon dioxide or CVD glass to a thickness of 800 Angstroms. Likewise, a layer 64 disposed over the insulator 62 may be a second insulator layer of, for example, silicon nitride to a thickness of 1600 Angstroms. A layer of material 66 at the bottom of the step may again be platinum silicide. Finally, a layer 68 disposed over the layers 64 and 66 may comprise a barrier material such as $Cr/Cr_2O_3$ to a thickness of 1600 Angstroms. An abrupt step 71 is formed in these layers in order to facilitate contact to the semiconductor material 60 disposed therebelow. Again, depending on the etching process utilized to form the step 71, the abrupt transition for the step may overhang a void area 70 therebelow.

The present invention again comprises the disposal of a first layer 36 of a first conductive material over the first and second surfaces 32 and 34, respectively. Again, a second conductive layer 40 is disposed over the first conductive layer 36. However, in this embodiment because the difference in levels between the first and second surfaces 32 and 34 is not as great as the difference in levels for the collector contact, the first and second end portions meet to form a continuous insulator seam 72 which follows the abrupt transition step 71. The length for this continuous insulator seam 72 should have a length which is less than 50% of the total combined thickness of the first and second layers 36 and 40. Again, this first layer 36 will have regions 74 adjacent to the insulator end portion seam 72 which have a lower material density as compared to the bulk of the first layer 36. In one embodiment, the materials for the first and second conductive layers 36 and 40 may be an alloy of aluminum and the insulator seam may be aluminum oxide.

It should be noted again that there is a substantial "good" coverage area 50 wherein no conductive material in the second layer 40 has been converted to insulator adjacent to the abrupt transition 71. This structure thus insures an absence of opens and shorts at this step transition for the contact.

A process for forming a conductive layer over an abrupt step between a first and second levels on the surface of an integrated circuit chip will now be described. With reference to FIG. 2, it should be noted that the deposition of the various semiconductor, insulator, and metal layers 20, 22, 24, 26, and 28 are well known in the art and will not be discussed in this disclosure. For further information on the deposition of these layers, please refer to the reference article by Fried, Havas, Lechaton, Logan, Paal, and Totta, IBM Journal of Research and Development, Vol. 26, No. 3, May 1982. The process for the present invention takes place in a chamber and comprises the steps of providing an oxygen source in the atmosphere of the processing chamber; depositing a first conductive layer to a first thickness which is less than the height of the step, with the first layer terminating in an end portion on the lower level of the step up to but not touching the base of the step, with the depositing step being performed at a first temperature and a first rate chosen to insure maximum gettering of undesired elements and to insure that the end portion of the first conductive layer is converted to an insulator. The method further comprises the step of depositing a second conductive layer to a thickness which is at least three times the thickness of the first layer, with a deposition temperature which is initially ramped from the first temperature to a second temperature which is at least fifty percent greater than the first temperature, and at a higher second rate relative to the first rate, so that conversion of portions of the second conductive layer to insulator is minimized.

In one embodiment of the present invention, a standard processing chamber such as the type manufactured by Temescal or Balzer may be utilized.

The first step of providing an oxygen source in the atmosphere of the processing chamber may be accomplished simply by venting the chamber to air or backfilling the chamber with $N_2O$. In some processes, $H_2O$ is put into the chamber for a water bleed step during the deposition of the barrier metal layer 28. This $H_2O$ may then comprise a source of oxygen in the chamber. The chamber may then be pumped down to $2 \times 10^{-6}$ Torr.

The next step is the first layer depositing step. It is preferred that this deposition step be at a first temperature of less than 125° C. However, the temperature to be used will depend on the conductive material being deposited in this step. For the deposition of AlCu, a temperature of less than 125° and typically on the order of 100° C. is preferred. This low temperature deposition may be accomplished by directional low temperature processes such as evaporation at approximately vertical incidence on to the surface. The deposition rate for this first layer should be on the order of 6 Angstroms per second or less, with a preferred range of 3-5 Angstroms per second. This low deposition rate and low temperature produces a condition for maximum gettering of oxygen during the initial stages of the deposition. This low temperature and low rate deposition also provides a reduced conductor atom mobility during the deposition process, which results in the creation of a porous, low density network of the conductor metal, with many voids at the edges of the first layer. The end portions 38 and 42 shown in FIG. 2 have this porous, low density network structure. Such structure directly facilitates the oxidation of these end portions. In the example where the first layer material is an aluminum alloy, then these end portions 38 and 42 are oxidized to an insulator which is a species of aluminum oxide. This aluminum oxide end portion or collar extends around the entire perimeter of the contact hole and acts as a diffusion barrier to metal "creep" or migration, thus preventing metal penetration. Typically, this end portion collar around the perimeter of the contact hole is disposed underneath the overhang of the sidewall of the step 30. This insulator end portion or collar 38 prevents any metal diffusion or migration into the active semiconductor region during any subsequent thermal cycle for the chip.

It should be noted that the voids or mouseholes 31 disposed below the overhangs provide a significant amount of surface area for the absorption of oxygen and water vapor. This absorption enhances the formation of the aluminum oxide at the end portions 38 adjacent to these voids or mouseholes. It has be theorized that the majority of oxygen utilized to oxidize the first conductive layer end portions 38 and 42 is coming from water vapor let into the processing chamber during venting. The reduction of the deposition temperature for this first conductive layer 36 to significantly less than the boiling point of water decreases the amount of water vapor that will be desorbed from the contact microstructure. This availability of oxygen in combination with the reduced mobility of the aluminum atoms during deposition due to the lower temperature, significantly enhances the creation of the aluminum oxide end portions.

Typically this first layer 36 will be deposited to a thickness in the range of 800-1600 Angstroms.

The next step in the process comprises depositing a second conductive layer 40 to a thickness which is at least 3 times the thickness of the first layer, with a deposition temperature which is initially ramped from the first temperature to a second temperature which is at least fifty percent greater than the first temperature, and at a higher second deposition rate relative to the first rate. By way of example, this second deposition step may be initiated after 900 Angstroms of the first layer 36 have been deposited.

In a preferred embodiment, the high deposition rate for this step is not initiated until the substrate has been raised to the proper temperature. Since it generally takes longer to raise the substrate temperature, a temperature ramp of, for example, 40–50 seconds is begun prior to initiation of the high deposition rate. Accordingly, the temperature in the processing chamber may be initially ramped to on the order of 180° C. or greater. For example, a ramp rate of 50° C. in one minute may be utilized. This temperature ramping within the chamber may be accomplished by utilizing the backside heaters present in typical tools. During this second deposition step, the pressure within the chamber in the example for the deposition of aluminum is maintained at $2\times 10^{-6}$ Torr.

After approximately 100 Angstroms have been deposited during this second deposition step, the deposition rate is ramped to a rate in the range of 10–30 Angstroms per second. A preferred rate for aluminum deposition might be 20 Angstroms per second ramped at a rate of 40 seconds +10 seconds. The deposition of this second layer 40 is continued at this second higher temperature and higher deposition rate until a desired thickness of 7000–10000 is achieved for this second layer. It should be noted that during this second layer deposition period the temperature may continue to increase by a certain amount. For example, the temperature may initially be ramped to a second temperature of 180° C. and continue to increase to a temperature of 200° C. at the end of this second deposition step. During this second deposition step, good vacuum conditions of on the order of $2\times 10^{-6}$ Torr should be maintained. A Meisner trap may be utilized to maintain the desired pressure. Note that any tool outgassing is accomplished via gettering during the first layer deposition step at the low temperature. Any excess gasses are then trapped by the Meisner system attachments.

At the end of the process, the shutter from the target is turned off, the substrate heaters are turned off, the power to the electron gun is turned off, and the rotation of the dome is stopped. The substrate is vacuum cooled for 2–5 minutes. Then the chamber is soft-vented.

It should be noted that this high temperature second layer deposition provides the conductor atoms being deposited with a sufficient mobility so that a higher density second conductor layer is obtained. This second conductor layer is not porous and does not contain the low density network of voids which facilitates oxidation of the structure.

From the above, it can be seen that a conductive layer deposition process has been disclosed which significantly increases wafer yield and satisfactory reliability by eliminating open collector and open emitter problems and preventing Schottky voltage degradation. This process is particularly advantageous for obviating the shadowing effects of nitride during a barrier metal deposition. Such shadowing limits the ability of the barrier metal vapor stream to effectively cover the contact edges of the material which it is protecting. This process may be advantageously used with a wide variety of deposition processes and is particularly advantageous with directional low-temperature evaporation and sputtering (where there is a high sticking coefficient). The present structure and process are specifically designed to prevent the formation of vertical insulator seams which run from the top of a conductor layer down to the bottom of a step. Such seams are particularly prone to occur along vertical steps during prior art processes with the occurrence of air leaks or when water vapor is bled into the system.

While the present invention has been particularly shown and described with reference to the preferred embodiments therefor, it will be understood by those skilled in the art that the foregoing and other changes in form and detail may be made therein without departing from the spirit and the scope of the present invention, as defined in the appended claims.

We claim:

1. An integrated circuit chip, including
   a first surface at a first approximate level;
   a second surface at a second different level approximately parallel to said first surface;
   a substantially abrupt transition between said first surface and said second surface, including a sidewall;
   a first layer of a first conductive material disposed over said first surface and disposed over said second surface, but terminating on said first surface in a first end portion which extends up to but does not touch said sidewall, said first layer having a thickness of less than the difference between said first and second levels;
   wherein said end portion of said first layer of conductive material has been converted to an insulator; and
   a second layer of a second conductive material disposed on top of said first layer, with essentially no conductive material conversion to insulator in said second layer adjacent to said abrupt transition.

2. An integrated circuit chip as defined in claim 1, wherein said sidewall is angled so that said first layer on said second surface overhangs a portion of said first layer on said first surface, and wherein said first layer on said first surface terminates under said sidewall overhang.

3. An integrated circuit chip as defined in claim 2, wherein said first layer disposed over said second surface has a second end portion disposed at an edge of said second surface above said abrupt transition, and wherein said second end portion of said first layer of conductive material has been converted to said insulator.

4. An integrated circuit as defined in claim 2, wherein said second conductive material is approximately the same as said first conductive material, but has a greater density than said first conductive material prior to sintering.

5. An integrated circuit as defined in claim 3, wherein said first and second conductive materials are aluminum alloys.

6. An integrated circuit as defined in claim 5, wherein said first and second surfaces are formed from a conductive material which is a barrier to penetration by said aluminum alloy first material.

7. An integrated circuit chip as defined in claim 5, wherein said end portions converted to insulator comprise aluminum oxide.

8. An integrated circuit as defined in claim 7, wherein a region of said first layer adjacent to said insulator end portion has a lower material density than the bulk of said first layer.

9. An integrated circuit as defined in claim 2, wherein said first and second surfaces are formed from a conductive material which is a barrier to penetration by said first conductive material.

10. An integrated circuit as defined in claim 3, wherein said insulator-converted end portion of said first layer on said first surface adjacent to said abrupt transition and said insulator-converted end portion of said first layer on said second surface adjacent to said abrupt transition meet to form a continuous insulator seam along said abrupt transition.

11. An integrated circuit as defined in claim 10, wherein said continuous insulator seam has a length which is less than fifty percent of the total combined thickness of said first and second layers.

12. An integrated circuit as defined in claim 2, wherein said insulator-converted end portion has a length which is less than thirty-three percent of the total combined thickness of said first and second layers.

13. An integrated circuit as defined in claim 3, wherein each of said insulator-converted end portions adjacent to said abrupt transition has a length which is less than twenty-five percent of the combined total of the lengths of said first and second layers.

14. An integrated circuit chip as defined in claim 2, wherein said insulator-converted end portion has a length rising from said first surface in the range of 900 to 1800 Angstroms.

15. An integrated circuit chip, including
a first approximate level;
a second level approximately parallel to and higher than said first approximate level;
a substantially abrupt transition with a sidewall between said first and second levels;
a first surface of conductive material disposed at said first approximate level;
a second surface of conductive material disposed at said second higher level;
wherein a portion of said conductive material of said second surface overhangs said first approximate level at said abrupt transition;
a first layer of an aluminum alloy disposed over said first surface and disposed over said second surface, said first layer terminating on said first surface in a first end portion which is disposed adjacent said overhang but does not touch said sidewall, and said second layer terminating on said second surface above said abrupt transition in a second end portion,
wherein said end portions of said first layer on said first surface adjacent to said abrupt transition and on said second surface above said abrupt transition have been converted to aluminum oxide; and
a second layer of an aluminum alloy disposed on top of said first layer, with essentially no aluminum oxide seam portions therein adjacent to said abrupt transition.

16. An integrated circuit chip as defined in claim 15, wherein a region of the first layer of aluminum alloy adjacent to the aluminum oxide end portions has a lower material density than the bulk of said first layer.

17. An integrated circuit chip as defined in claim 16, wherein said first and second surfaces are formed from a material which is a barrier to penetration by said aluminum alloy.

18. An integrated circuit as defined in claim 16, wherein said aluminum oxide end portion of said first layer on said first surface adjacent to said abrupt transition and said aluminum oxide end portion of said first layer on said second surface adjacent to said abrupt transition meet to form a continuous insulator seam along said abrupt transition, wherein said seam has a length which is less than fifty percent of the total combined thickness of said first and second layers.

19. An integrated circuit chip as defined in claim 16, wherein said aluminum oxide end portions each have a length in the range of 900 to 1800 Angstroms.

20. An integrated circuit as defined in claim 16, wherein said aluminum oxide end portions each have a length which is less than twenty-five percent of the total combined thickness of said first and second layers.

21. An integrated circuit as defined in claim 16, wherein each of said aluminum oxide end portions adjacent to said abrupt transition has a length which is less than twenty percent of the combined total of said first and second layers.

* * * * *